United States Patent
Laham et al.

(10) Patent No.: US 7,633,674 B2
(45) Date of Patent: Dec. 15, 2009

(54) SOA-MZI DEVICE FAULT ISOLATION

(75) Inventors: Mohammad Laham, Basking Ridge, NJ (US); Boris Stefanov, Gillette, NJ (US)

(73) Assignee: Alphion Corporation, Princeton Junction, NJ (US)

(*) Notice: Subject to any disclaimer, the term of this patent is extended or adjusted under 35 U.S.C. 154(b) by 0 days.

(21) Appl. No.: 12/254,380

(22) Filed: Oct. 20, 2008

(65) Prior Publication Data

US 2009/0041454 A1  Feb. 12, 2009

Related U.S. Application Data

(63) Continuation of application No. 10/446,451, filed on May 28, 2003, now Pat. No. 7,440,179.

(60) Provisional application No. 60/384,063, filed on May 29, 2002.

(51) Int. Cl.
*H01S 5/00* (2006.01)
*H04B 10/08* (2006.01)
*G02B 6/28* (2006.01)
*H04B 10/12* (2006.01)

(52) U.S. Cl. .................... 359/344; 385/24; 398/10; 398/13; 398/20

(58) Field of Classification Search ............... 359/344; 385/24; 398/10, 13, 20
See application file for complete search history.

(56) References Cited

U.S. PATENT DOCUMENTS

| | | | | |
|---|---|---|---|---|
| 4,257,033 A | * | 3/1981 | Ota et al. ............... | 340/870.16 |
| 4,904,036 A | * | 2/1990 | Blonder .................... | 385/14 |
| 6,445,477 B1 | * | 9/2002 | Madsen et al. ............ | 398/192 |
| 6,973,232 B2 | * | 12/2005 | Betty et al. ................ | 385/29 |
| 7,257,296 B2 | * | 8/2007 | Kim et al. ................. | 385/42 |
| 2001/0009594 A1 | * | 7/2001 | Hosoi ........................ | 385/2 |
| 2002/0053678 A1 | * | 5/2002 | Shiba et al. ............... | 257/98 |
| 2003/0081878 A1 | * | 5/2003 | Joyner et al. ............. | 385/14 |
| 2003/0152324 A1 | * | 8/2003 | Betty et al. ............... | 385/29 |
| 2004/0252945 A1 | * | 12/2004 | Kim et al. ................. | 385/42 |
| 2006/0093369 A1 | * | 5/2006 | Nagarajan ................ | 398/135 |

* cited by examiner

*Primary Examiner*—Eric Bolda
(74) *Attorney, Agent, or Firm*—Kaplan Gilman & Pergament LLP

(57) ABSTRACT

A photonic integrated circuit having a plurality of circuit components, is disclosed, which may include an MMI for splitting signal power passing therethrough among first and second optical pathways coupled to first and second outputs, respectively, of the MMI, thereby directing first and second percentages of the signal power along the first and the second optical pathways, respectively; and a photodetector integrated into the photonic integrated circuit and coupled to said first optical pathway for measuring a signal power level on said first optical pathway.

6 Claims, 6 Drawing Sheets

SOA-MZI WITH INTEGRATED MONITORING

*ACTIVE SOAs ARE LABELED AS "SOA"
*PHOTODETECTORS ARE LABLED AS "PD"

SOA-MZI DEVICE FAULT ISOLATION

CROSS-REFERENCE TO RELATED APPLICATIONS

This application is a Continuation of U.S. patent application Ser. No. 10/446,451, filed May 28, 2003, entitled "SOA-MZI Device Fault Isolation" which claims the benefit of U.S. Provisional Patent Application 60/384,063, filed May 29, 2002, entitled "SOA-MZI Device Fault Isolation," both of which prior applications are incorporated by reference herein in their entirety.

TECHNICAL FIELD

This invention relates to optical communications networks. More particularly, the invention relates to a method and apparatus for internal monitoring and fault isolation in photonic integrated circuits (PICs).

BACKGROUND OF THE INVENTION

Photonic integrated circuits (PICs) are, in the general sense, integrated devices comprising passive components such as waveguides and multi-mode interferometers (MMIs), as well as active components such as Semiconductor Optical Amplifiers (SOAs).

While certain single-active optical devices such as lasers are available with back facet monitors, PICs, such as wavelength converters, 2R devices, modulators, etc. simply do not have monitoring capability. In order to test them, one must attach optical inputs and outputs, align these test inputs and outputs, and deal with sorting out the difference between input and output signal power attenuation due to internal problems and that due to misalignment of the test probes or losses through the test probe interfaces to the PIC.

Further exacerbating the problem is that one simply cannot assume a given PIC is fully operable. The plain fact is that there are few, if any, commercially available PIC devices that actually deliver their stated specifications. Generally some monitoring is needed, at the manufacturing as well as operational stages to tractably utilize these devices.

What is needed in the art is an efficient method for monitoring PIC devices.

BRIEF DESCRIPTION OF THE DRAWINGS

For the purposes of illustrating the various aspects of the invention, there are shown in the drawings forms that are presently preferred, it being understood, however, that the invention is not limited to the precise arrangements and instrumentalities shown.

DETAILED DESCRIPTION OF THE PREFERRED EMBODIMENTS

Figure 1:
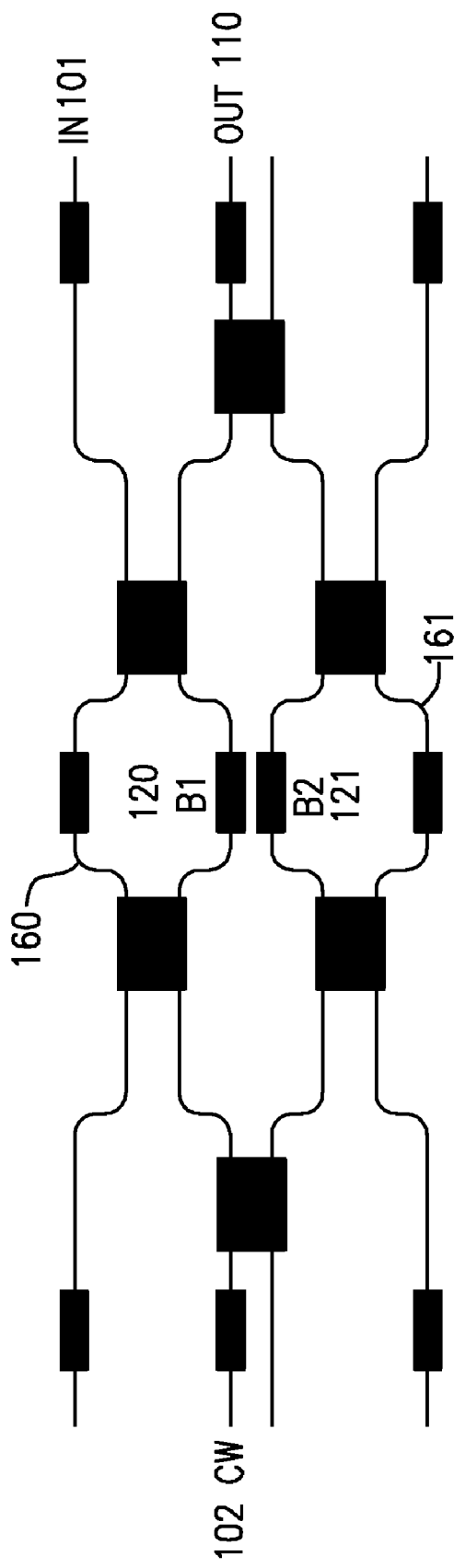
FIG. 1 depicts an exemplary PIC with redundancy.

The above-described problems of the conventional art are solved in accordance with the method and apparatus of the present invention. A novel method and apparatus for internal monitoring and fault isolation in photonic integrated circuits (PICs) is presented.

Before one or more embodiments of the invention are explained in detail, it is to be understood that the invention is not limited in its application to the details of construction or the arrangements of components set forth in the following description or illustrated in the drawings (the terms "construction" and "components" being understood in the most general sense and thus referring to and including, in appropriate contexts, methods, algorithms, processes and sub-processes). The invention is capable of other embodiments and of being practiced or being carried out in various ways. Also, it is to be understood that the phraseology and terminology used herein is for the purposes of description and should not be regarded as in any way limiting.

To illustrate the method and apparatus of the present invention, an AO2R (all optical regeneration and reshaping)/Wavelength Conversion device will be used as an exemplary PIC. Such a device is depicted in FIG. 1, and is the subject of a pending US Patent Application under common assignment herewith, and thus not prior art hereto, entitled "REDUNDANT PATH ALL-OPTICAL REGENERATION, RESHAPING AND WAVELENGTH CONVERSION FOR ENHANCED YIELD" filed on May 15, 2002, with David Lidsky and Jithamithra Sarathy as Applicants (the "AO2R Patent") (U.S. application Ser. No. 10/147,333, now issued U.S. Pat. No. 7,203,427).

Figure 4:
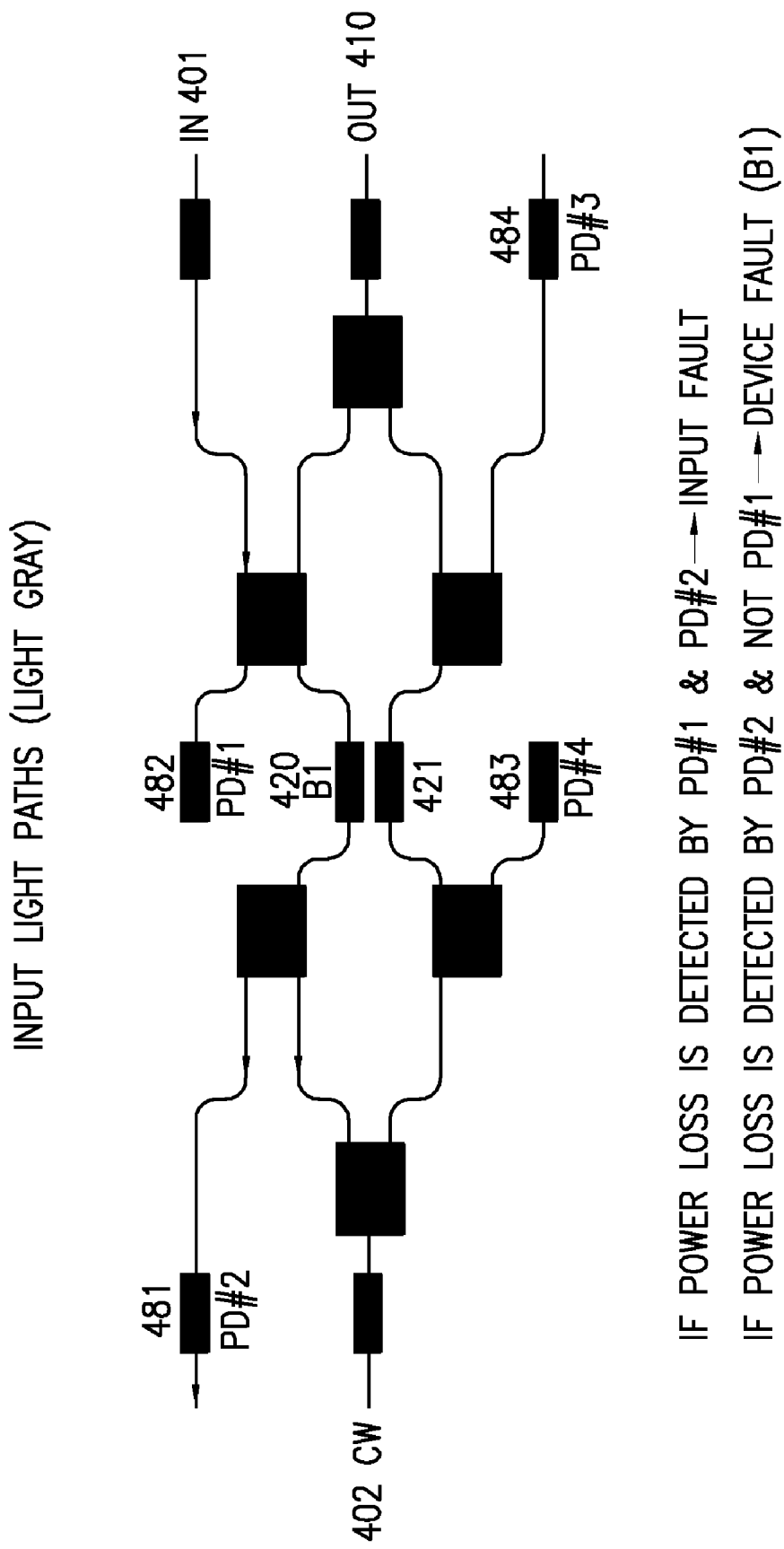
FIG. 4 shows the input signal lightpaths for the device of FIG. 2 according to the present invention.

As described in the AO2R Patent, due to inherent redundancy of the circuit of FIG. 1, there are numerous possible circuit points at which to place the input data signal, the input CW light source, and the output signal. With reference to FIG. 1, for the purposes of illustration, an arbitrary placing of the "dirty" input data signal at 101, the CW input at 102 and the "clean" output at 103 has been made. Given this placing, one of the SOAs from the bottom pair needs to be biased for destructive interference relative to one SOA from the top pair by externally electrically biasing one of the lower SOAs. Thus, the chosen top SOA will undergo signal induced phase shift upon receipt of an incoming "1" or "high" signal. With reference to FIG. 1, again, arbitrarily chosen for illustration purposes, SOA B1 120 is the chosen top SOA, and SOA B2 121 is the chosen bottom SOA. Similar numerical designations are used throughout this application for the elements corresponding to those of FIG. 1; the only change is with the hundreds place digit. Thus the CW input in FIG. 4 is designated as "402", etc . . .

Given these choices for inputs, outputs, and signal paths, there are certain unneeded optical pathways, such as path segments 160 and 161. This is because if the input signal enters at 101 and flows through B1 120 to induce phase modulation, neither the portion of the input signal 101 nor the portion of CW signal 102 traveling through segment 160 has any function. Similarly, if B2 121 is used as the externally electrically biased SOA, then the CW signal 102 traveling through segment 161 also has no function. In fact, these superfluous signals would normally be absorbed by the non signal path SOAs, via appropriate biasing of these SOAs or other means.

Figure 2:
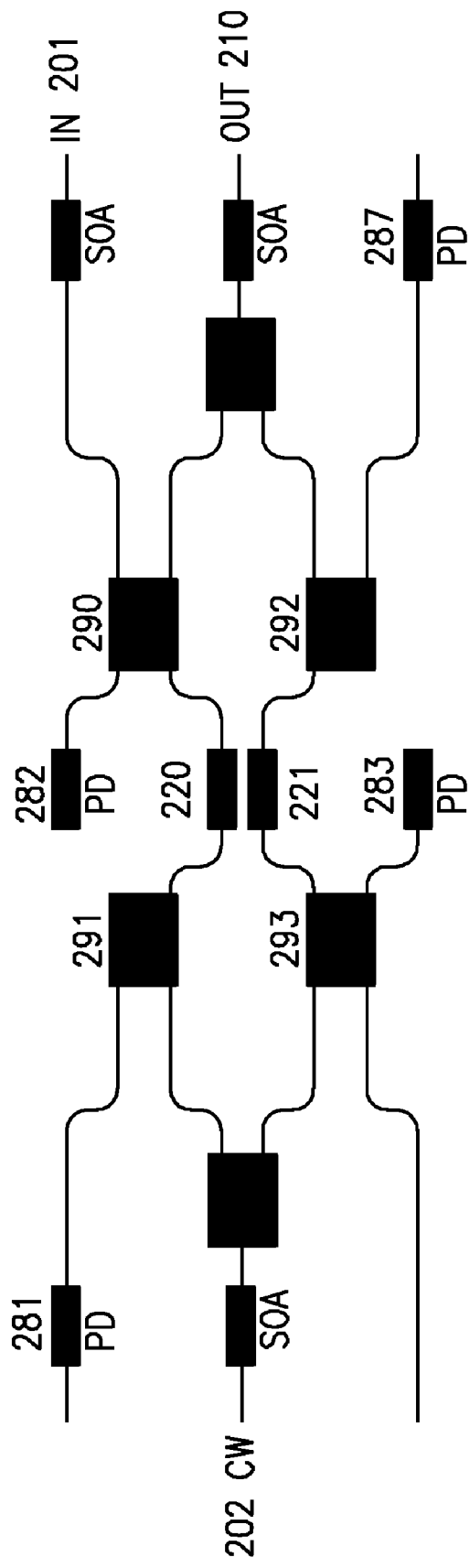
FIG. 2 depicts modifications of the device of FIG. 1 according to the present invention.

The present invention uses these non-signal path SOAs as photodetectors, and in so doing allows a PIC device is to be fabricated with built-in internal power monitors, as shown in FIG. 2, where unneeded waveguide segments 160 and 161 from FIG. 1 have been removed, and SOAs 281, 282, 283 and 284 have been modified to function as photodetectors. Alternatively, if a PIC device does not have inherent redundancy, the reverse process can be implemented at the design level. Redundant pathways can be added to the design and photodetectors placed therein to implement the method of the present invention.

With reference to FIG. 2, collectively, the integrated monitors will have the ability to isolate faults to a single source: either (a) the incoming line signal 201 (the "dirty" signal to be regenerated & reshaped in the AO2R exemplary PIC device); (b) the incoming CW signal (the clean reference signal); or an internal chip (one of the SOAs).

In general SOAs can be converted to photodetectors (PD), either by reversing the current bias or by modifying design.

Figure 3:
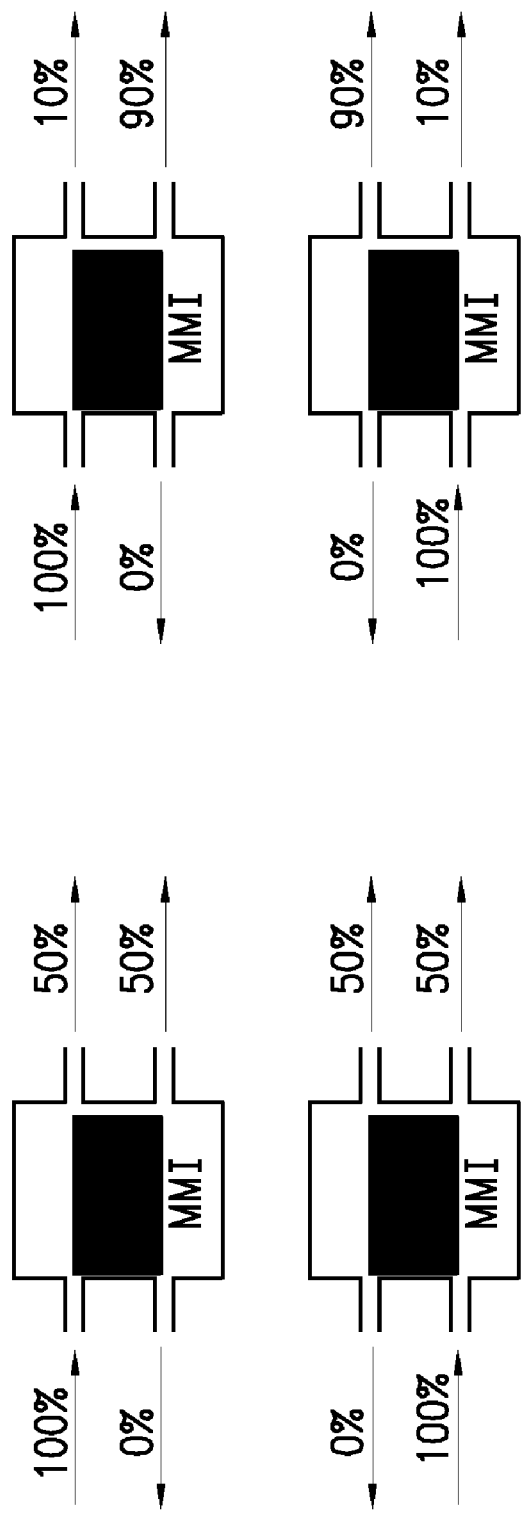
FIG. 3 shows the passive MMI portion of the device of the present invention with various possible splitting of input power.

Once a given SOA is to operate as a photodetector, there is no reason to continue to route one-half of the optical signal to it. Thus, for reasons of efficiency, with reference to FIG. 2, MMIs whose outputs are the PDs, i.e. 290, 291, 292, and 293 could have their splitting ratio modified from 50:50 to 90:10, where 10% goes to the downstream PD. FIG. 3 depicts MMIs having a 50:50 splitting ratio, and corresponding MMIs with a 90:10 splitting ratio.

To make the analysis for fault isolation, the PDs can be connected to Trans-Impedance Amplifiers and the light detected at the PD thereby measured. If the light detected at the PD is less than a pre-set threshold, a fault is declared.

The following advantages are offered by internal fault isolation/monitoring according to the method of the present invention:

Low cost.

Small Size.

Integrated design.

Fault isolation to a single source.

E.g., in the exemplary circuit of FIG. 2, the input path through PDs 283 and 284 is distinct from the CW input path through PDs 290 and 291, thus allowing fault isolation to be pinpointed to either the "dirty" input.

Accurate (No external components).

Flexible Design (The Detection Threshold can be set by the user).

Figure 5:
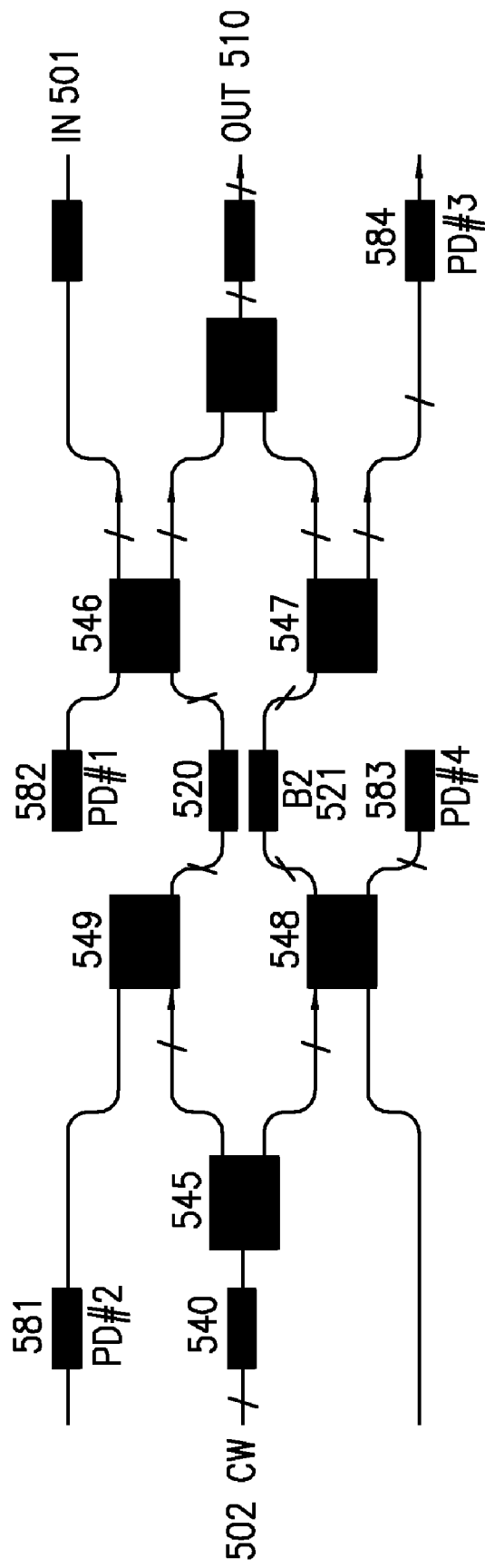
FIG. 5 shows the CW input lightpaths for the device of FIG. 2 according to the present invention.
Figure 6:
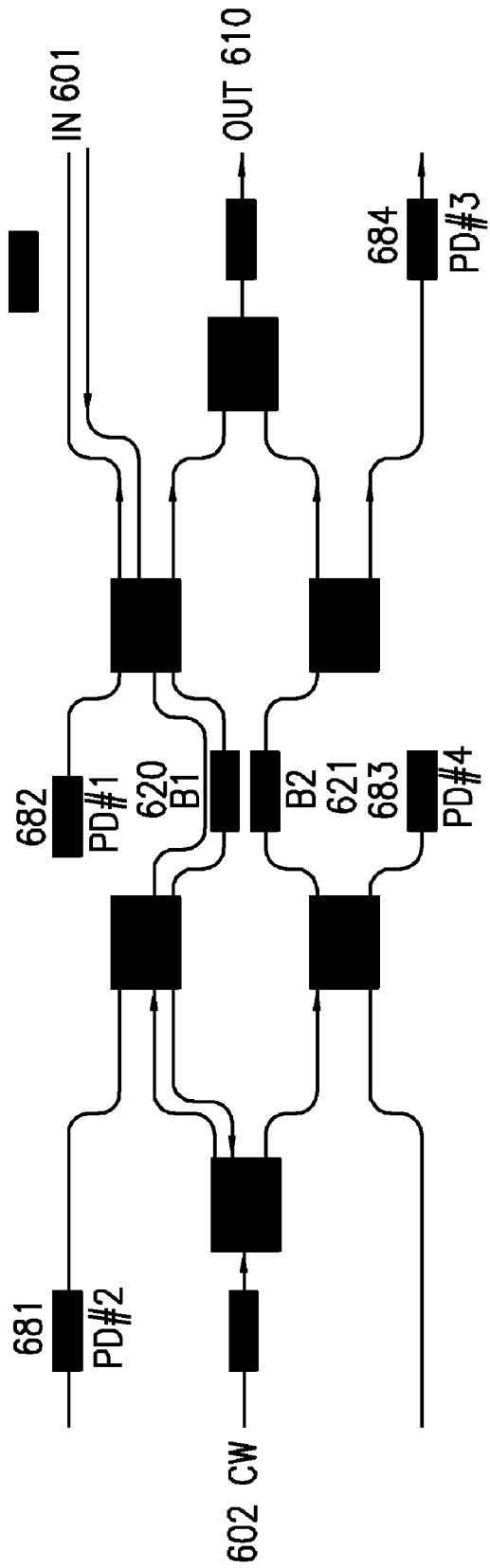
FIG. 6 depicts the lightpaths of FIGS. 4 and 5 superimposed.

FIGS. 4-6 each depict the exemplary device of FIG. 2. FIGS. 4 and 5 illustrate the lightpaths for the "dirty" input data signal and the CW reference signal respectively.

With reference to FIG. 4, the light gray waveguides represent the lightpaths for the input data signal 401. As can be seen with reference to FIG. 4, there are two photodetectors involved in fault isolation relative to this input data signal 401, PD#1 482 and PD#2 481. As the legend at the bottom of FIG. 4 states, if the power loss is detected by both PD#1 482 and PD#2 481 then there is a fault on the input 401. If the power loss is detected only by one of these two photodetectors then two situations are possible. If a power loss is detected by PD#2 481 and not PD#1 482, then the input signal is good and the problem must lie with the only active device in line between the input signal 401 and photodetector PD#2 481; hence the fault lies with SOA B1 420. If a power loss is detected by PD1 and not PD2, no conclusions can be drawn. If no power loss is detected by either PD#1 482 or PD#2 481, then there is no fault whatsoever. The various possible combinations of faults detected at photodetectors PD#1 and PD#2 are summarized in Table 1 below.

TABLE 1

Input Fault Isolation

| PD#1 | PD#2 | Fault |
|---|---|---|
| 0 | 0 | None |
| 1 | 0 | N/A |
| 0 | 1 | Device (B1) |
| 1 | 1 | Input |

FIG. 5 depicts the lightpaths used in monitoring the CW input 502. Because it is difficult to display colors of gray crosshatching has been used to denote the lightpaths of the CW signal 502. As can be seen from FIG. 5, the CW signal 502 enters through an initial SOA 540 and from there passes into an MMI 545 which splits the signal into two different parts. MMI 545 splits the input power equally, i.e. in a 50:50 ratio, inasmuch as each output arm is recombined via SOAs 520 and 521 for constructive or destructive interference as more fully described in the AO2R Patent. The portion of the CW input signal 502 that can be subjected to internal monitoring is carried through MMIs 548 and 547 with reference to FIG. 5. It is these MMIs that can be set to a non-equal input power split, such as 90:10, tapping the smaller fraction of their input power for the monitoring output arm, as described above. As can be seen, PD#4 583 and PD#3 584 are involved in monitoring the CW input signal 502. As the legend on the bottom of FIG. 5 indicates, if a power loss is detected by both PD#4 583 and PD#3 584, it can be concluded that there is a fault with the CW input signal 502. If a power loss is detected by PD#3 584 only, then it could be concluded that the only in line active device, which is SOA B2 521, is the source of the fault. If a power loss is detected by PD#4 583 only and not PD#3 584, nothing definitive can be concluded. The various possible results and their meanings are summarized in Table 2 below.

TABLE 2

CW Fault Isolation

| PD#4 | PD#3 | Fault |
|---|---|---|
| 0 | 0 | None |
| 1 | 0 | N/A |
| 0 | 1 | Device (B2) |
| 1 | 1 | CW |

FIG. 6 repeats and superimposes the information contained in FIGS. 4 and 5, allowing the viewer to see the entire fault isolation system synoptically. While the example of the PIC device of FIG. 2 has been used to illustrate the present invention, as described above any optical integrated circuit could be enhanced by the method and apparatus of the present invention simply by adding redundant pathways for the optical signals desired to be monitored and placing photodetectors in such pathways.

As well, a photonic integrated circuit or PIC does not need to contain MMIs in order for the method of the present invention to be applicable. The present invention is intended to be applied to any type or method of signal tapping for monitoring purposes such as, for example, directional couplers.

Finally, it is also possible to implement the method of the present invention where signals which are desired to be monitored co-propagate through a given detecting device. In the example described above, there was no photodetector whose input was more than one signal. With reference to FIG. 2, the photodetectors on the top of the figure were used to monitor the input signal 201 and the photodetectors on the bottom of the figure were utilized to monitor the input CW signal 202. A circuit could just as well be created such that photodetectors receive light from two different sources which are desired to be monitored. In such case, there simply needs to be some type of filtration or selection of the various co-propagating signals so that a given input could be isolated.

While the above describes the preferred embodiments of the invention, various modifications or additions will be apparent to those of skill in the art. Such modifications and additions are intended to be covered by the following claims.

The invention claimed is:

1. A photonic integrated circuit having a plurality of circuit components, comprising:
   an MMI for splitting signal power passing therethrough among first and second optical pathways coupled to first and second outputs, respectively, of the MMI, thereby directing first and second percentages of the signal power along the first and the second optical pathways, respectively; and
   a photodetector integrated into the photonic integrated circuit and coupled to said first optical pathway for measuring a signal power level on said first optical pathway,
   wherein the photodetector is operable to compare the measured signal power level to a detection threshold, and to signal a fault if the measured signal power is less than the detection threshold.

2. The photonic integrated circuit of claim 1 wherein the second optical pathway is coupled to at least one signal path of the photonic integrated circuit.

3. The photonic integrated circuit of claim 1 wherein the first percentage is between 10% and 50%.

4. A photonic integrated circuit comprising:
   a plurality of MMIs (Multi-Mode Interferometers) in the photonic circuit, wherein each said MMI is operable to divide optical energy input thereto between a signal output and a monitoring output, with all of the outputs receiving a non-zero allocation of the input optical energy;
   at least two photodetectors operable to receive monitoring output energy from respective monitoring outputs of at least two respective MMIs along respective optical waveguides;
   wherein each said photodetector, having a given one of the waveguides leading thereto, is operable to indicate a presence of a fault in the circuit if the monitoring signal energy received along the given waveguide leading thereto is less than a detection threshold, the circuit thereby providing a plurality of photodetector indications; and
   wherein the integrated circuit enables isolating a location of the fault within the circuit based on a presence or absence of fault indications at plurality of photodetectors.

5. The photonic circuit of claim 4 wherein the detection threshold of at least one said photodetector is user adjustable.

6. The photonic circuit of claim 4 wherein the photonic circuit enables isolating a location of the fault in the circuit according to a monitoring algorithm.

* * * * *